(12) United States Patent
Osato (10) Patent No.: US 7,815,473 B2
(45) Date of Patent: Oct. 19, 2010

(54) CONTACT AND CONNECTING APPARATUS

(75) Inventor: Eichi Osato, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 288 days.

(21) Appl. No.: 12/149,309

(22) Filed: Apr. 30, 2008

(65) Prior Publication Data

US 2008/0315893 A1     Dec. 25, 2008

(30) Foreign Application Priority Data

Jun. 22, 2007   (JP)  ............................. 2007-165193

(51) Int. Cl.
*H01R 13/24*    (2006.01)
(52) U.S. Cl. ........................... 439/700; 439/66; 439/72
(58) Field of Classification Search .................. 439/66, 439/700, 72
See application file for complete search history.

(56) References Cited

U.S. PATENT DOCUMENTS

| | | | | |
|---|---|---|---|---|
| 5,102,343 | A * | 4/1992 | Knight et al. | 439/67 |
| 5,230,632 | A * | 7/1993 | Baumberger et al. | 439/66 |
| 5,540,594 | A * | 7/1996 | Collins et al. | 439/66 |
| 5,921,786 | A * | 7/1999 | Slocum et al. | 439/72 |
| 5,955,888 | A * | 9/1999 | Frederickson et al. | 324/761 |
| 6,071,137 | A * | 6/2000 | Rutigliano | 439/197 |
| 6,217,341 | B1 * | 4/2001 | Glick et al. | 439/66 |
| 6,763,581 | B2 * | 7/2004 | Hirai et al. | 29/852 |
| 6,935,096 | B2 * | 8/2005 | Haiun | 60/39.5 |
| 7,019,222 | B2 * | 3/2006 | Vinther | 174/260 |
| 7,126,062 | B1 * | 10/2006 | Vinther et al. | 174/260 |
| 7,190,179 | B2 * | 3/2007 | Haga et al. | 324/754 |
| 7,338,294 | B2 * | 3/2008 | Polnyi | 439/66 |
| 7,556,503 | B2 * | 7/2009 | Vinther | 439/66 |

FOREIGN PATENT DOCUMENTS

| | | |
|---|---|---|
| JP | 2002-022768 | 1/2002 |
| JP | 2005-351785 | 12/2005 |

* cited by examiner

*Primary Examiner*—Truc T Nguyen
(74) *Attorney, Agent, or Firm*—Bacon & Thomas, PLLC (57) ABSTRACT

A contact and a connecting apparatus are provided to enable miniaturization and shortening and cost reduction in response to further miniaturization and finer pitch of inspection objects. The contact is one electrically for contacting a terminal of a wire and includes a one-side plunger portion, an other-side plunger portion, and an elastic deformation portion provided between the plunger portions. The elastic deformation portion is made of an annular and conductive elastic member integrally connected to the one-side plunger portion and the other-side plunger portion. The plurally arranged elastic deformation portions are disposed in a zigzag shape in the up-down direction with their adjacent heights different from each other. The connecting apparatus includes the plurality of contacts electrically contacting terminals disposed on an inspection object and a contact plate for integrally supporting the respective contacts to make the contacts contact with the respective terminals of the inspection object.

16 Claims, 10 Drawing Sheets

CONTACT AND CONNECTING APPARATUS

CROSS-REFERENCE TO RELATED APPLICATION

This application claims, under 35 USC 119, priority of Japanese Application No. 2007-165193 filed on Jun. 22, 2007.

BACKGROUND OF THE INVENTION

1. Technical Field Relating to the Invention

The present invention relates to a contact and a connecting apparatus electrically contacting a terminal of an inspection object such as an IC circuit, a liquid crystal display panel, a semiconductor wafer, etc. or a terminal of a wire around it.

2. Description of Related Art

An inspection object such as an IC circuit, a liquid crystal display panel, a semiconductor wafer, etc. undergoes various kinds of inspections. These inspections are conducted generally by electrically contacting a terminal of a circuit of an inspection object, a terminal of a wire around it, or the like and sending electrical signals to it. To electrically contact the terminal of the wire or the circuit, a contact is used.

Figure 14:
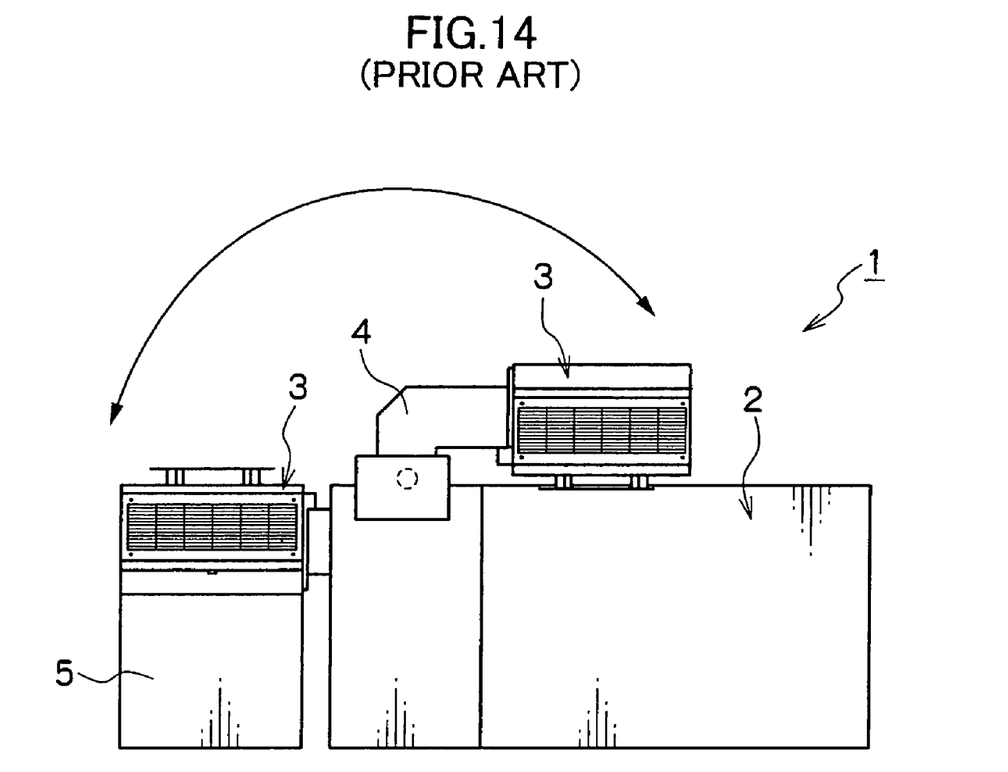
FIG. 14 is a side view showing a conventional inspection apparatus.

An example of an inspection apparatus using this contact is shown in FIG. 14. An inspection apparatus 1 is mainly constituted by a prober apparatus 2 for supporting and electrically contacting the inspection object to conduct an inspection of electrical characteristics, an inspection apparatus test head 3 for electrically contacting terminals (not shown) of circuits of the inspection object by means of contacts (not shown) of a probe card of this prober apparatus 2, and a head turning apparatus 4 for supporting this inspection apparatus test head 3 and turning it to the prober apparatus 2 side for the inspection as well as turning it to a mounting table 5 side for standby.

Figure 15:
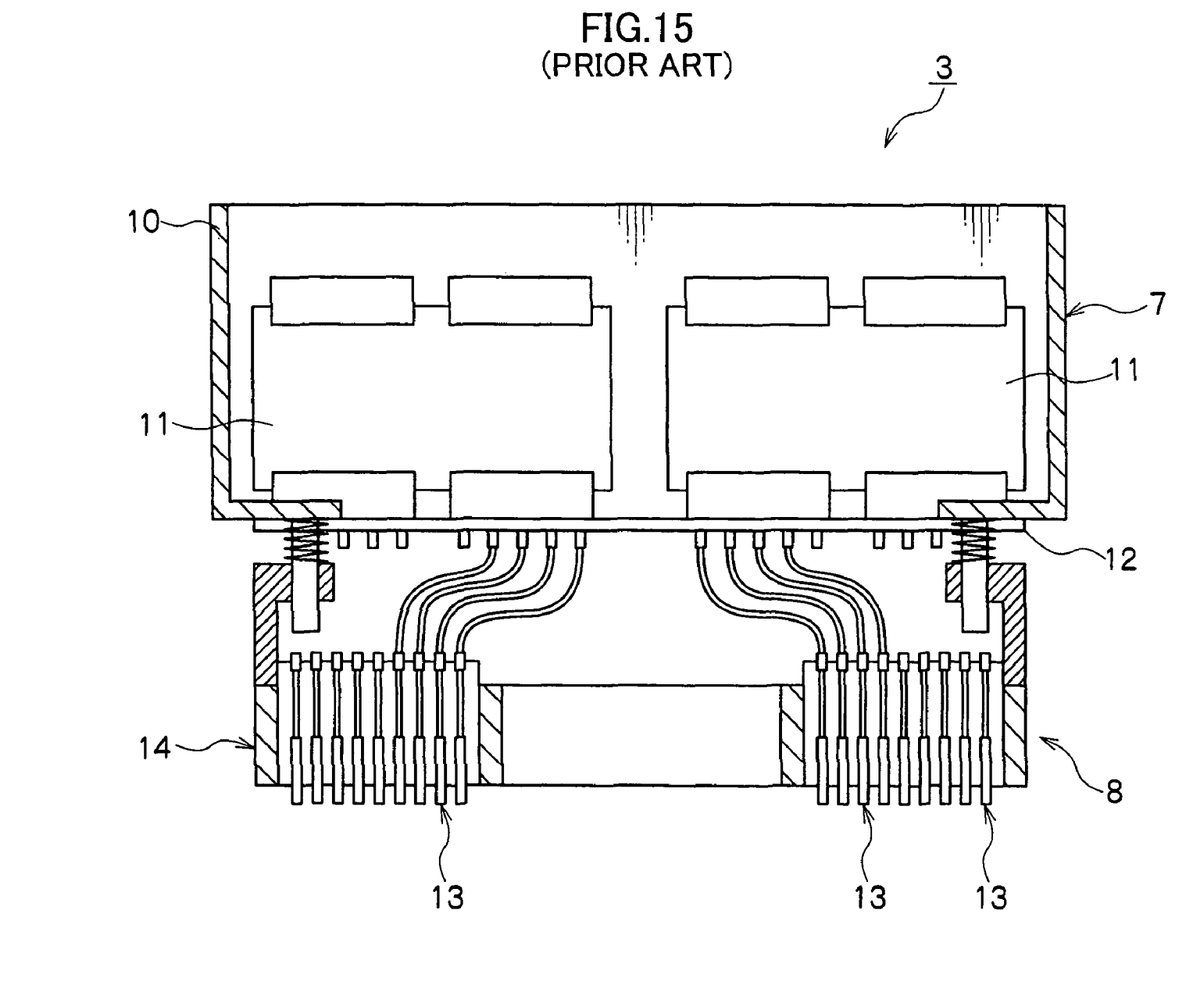
FIG. 15 is a cross-sectional view showing an inspection apparatus test head for the conventional inspection apparatus.

The inspection apparatus test head 3 is mainly constituted by a main body portion 7 and a pogo pin portion 8 as shown in FIG. 15.

The main body portion 7 is mainly constituted by a frame 10, a pin card 11, and a back board 12 and electrically connects wires (not shown) from a control section side to aftermentioned respective pogo pins 13. The pogo pin portion 8 is constituted by a pogo pin head 14 for supporting the numerous pogo pins 13.

Also, an IC socket (not shown) comprising numerous pogo pins exists as well.

The aforementioned pogo pin 13 has an expansion/contraction function and reliably contacts a terminal of a circuit for electrical connection. As an example of such a pogo pin, an integrated circuit package inspection pogo pin described in Japanese patent Laid-open No. 2002-22768 (Patent Document 1) is raised. This integrated circuit package inspection pogo pin comprises an outer casing, a plunger slidably housed in this outer casing and moving vertically, and a spring housed in the outer casing and biasing the plunger to a terminal side and elastically supports the plunger by the spring in a state where the plunger contacts the terminal.

However, the pogo pin structured in this manner has a complicated structure, which causes high cost. Also, under a circumstance where there is a demand for further miniaturization and finer pitch in recent integrated circuits, the pogo pin structure using the spring has difficulty in meeting the demand for miniaturization and fine pitch.

As means for solving this problem, a contact pin and a pogo pin described in Japanese patent Laid-open No. 2005-351785 (Patent Document 2) are raised. The contact pin and pogo pin have a bellows structure, and a portion having this bellows structure functions as a spring.

However, the contact pin and the pogo pin described in Patent Document 2 also have a complicated structure, which causes high cost.

Further, along with further miniaturization and finer pitch of IC circuits, etc. as inspection objects, there is a demand for miniaturization of the pogo pin and shortening of the pin length. However, the pogo pin structure using the spring or the bellows described in Patent Document 1 or 2 has difficulty in meeting the demand for miniaturization and shortening.

SUMMARY OF THE INVENTION

The present invention is accomplished by taking such the problems as mentioned above into consideration thereof, and an object thereof is to provide a contact and a connecting apparatus for enabling miniaturization and shortening and cost reduction in response to further miniaturization and finer pitch of inspection objects.

To solve the above problems, a contact according to the present invention is a contact for electrically contacting a terminal of a wire, and comprises a one-side plunger portion, an other-side plunger portion, and an elastic deformation portion provided between the plunger portions, wherein the elastic deformation portion is made of an annular and conductive elastic member integrally connected to the one-side plunger portion and the other-side plunger portion.

With the above structure, the elastic deformation portion made of an annular and conductive elastic member is integrally connected to the one-side plunger portion and the other-side plunger portion, and thus the elastic deformation portion transmits electrical signals between the one-side plunger portion and the other-side plunger portion. Also, elastic deformation of the elastic deformation portion expands and contracts the contact elastically.

The plurally arranged elastic deformation portions may be disposed in a zigzag shape in the up-down direction with their adjacent heights different from each other. The inside of the annular elastic deformation portion may be filled with an elastic body. The plural annular elastic deformation portions may be connected in the up-down direction. A part of the annular elastic deformation portion may be cut.

A connecting apparatus according to the present invention comprises a plurality of contacts electrically contacting terminals disposed on an inspection object, and a contact plate for integrally supporting the respective contacts to make the contacts contact with the respective terminals of the inspection object, wherein each contact has a one-side plunger portion, an other-side plunger portion, and an elastic deformation portion provided between the plunger portions, and wherein the contact plate has a guide recess fitting in with the elastic deformation portions of the respective contacts to house the respective elastic deformation portions.

With the above structure, the elastic deformation portion of each contact is elastically deformed within the guide plate of the contact plate to elastically support the one-side plunger portion and the other-side plunger portion.

The elastic deformation portion is preferably made of an annular and conductive elastic member integrally connected to the one-side plunger portion and the other-side plunger portion. The guide recess may be formed in an elongated shape, the elastic deformation portions of the plurality of contacts may be housed in the guide recess simultaneously, and the respective elastic deformation portions may be disposed within the guide recess in a zigzag shape in the up-down direction with their heights different from each other.

The inside of the annular elastic deformation portion may be filled with an elastic body. The plural annular elastic deformation portions may be connected in the up-down direction. A part of the annular elastic deformation portion may be cut.

Even in a case where the heights of the terminals or the likes that the respective contacts contact are not uniform, the elastic deformation portions are deformed to absorb the height difference, which leads to reliable contact.

Since the contact consists of the one-side plunger portion, the other-side plunger portion, and the elastic deformation portions provided between the plunger portions, the structure is simple, and the contact can be smaller and shorter in response to further miniaturization and finer pitch of inspection objects. Also, since the structure is simple, the manufacturing cost can be reduced.

BRIEF DESCRIPTION OF DRAWINGS

Those and other objects, features and advantages of the present invention will become more readily apparent from the following detailed description when taken in conjunction with the accompanying drawings wherein:

FIGS. 2 (A) and 2 (B) are side views showing the contact according to the first embodiment of the present invention.

DETAILED DESCRIPTION OF THE PREFERRED EMBODIMENTS

Hereinafter, a contact and a connecting apparatus according to the embodiments of the present invention will be described with reference to the attached drawings. The contact and the connecting apparatus according to the present invention are incorporated into an inspection apparatus. This inspection apparatus is one that inspects electrical characteristics of integrated circuits (integrated circuits formed in an inspection object such as an IC circuit, a liquid crystal display panel, a semiconductor wafer, etc.) or the likes. The contact and the connecting apparatus are adapted to provide electrical connection to a terminal of a wire of an IC circuit or the like, a terminal in the middle of a wire from a control section to the terminal of the IC circuit or the like, which is a wire around the terminal (e.g., a terminal at a contact portion between the apparatus main body and a probe card), or the like in the inspection apparatus. Since the contact and the connecting apparatus only require an apparatus to provide the aforementioned electrical connection, they may be used for any apparatus other than the aforementioned inspection apparatus as long as the apparatus has a portion that performs electrical connection by the contact.

(A) First Embodiment

In the present embodiment, explanation will be made on a contact according to the present invention. A contact is one electrically contacting a terminal of a wire that sends electrical signals or of a circuit (a terminal of an IC circuit or a terminal of a wire around it). A contact 21 is constituted by a one-side plunger portion 22, an other-side plunger portion 23, and an elastic deformation portion 24 provided between the one-side plunger portion 22 and the other-side plunger portion 23, as shown in FIGS. 1 and 2.

The one-side plunger portion 22 is a member located on one side (upper side in FIG. 1) of the contact 21 and is slidably inserted in a slide support hole 26 of a one-side slide support portion 25. The one-side slide support portion 25 is made of a material with insulation characteristics so as not to cause a negative effect on transmission of electrical signals at the one-side plunger portion 22. The one-side slide support portion 25 is fixed to a support portion (not shown) on an inspection apparatus side. The tip edge portion (upper edge portion) of the one-side plunger portion 22 is cut in a crown-like shape for easy electrical contact with a terminal on the opposite side.

Figure 1:
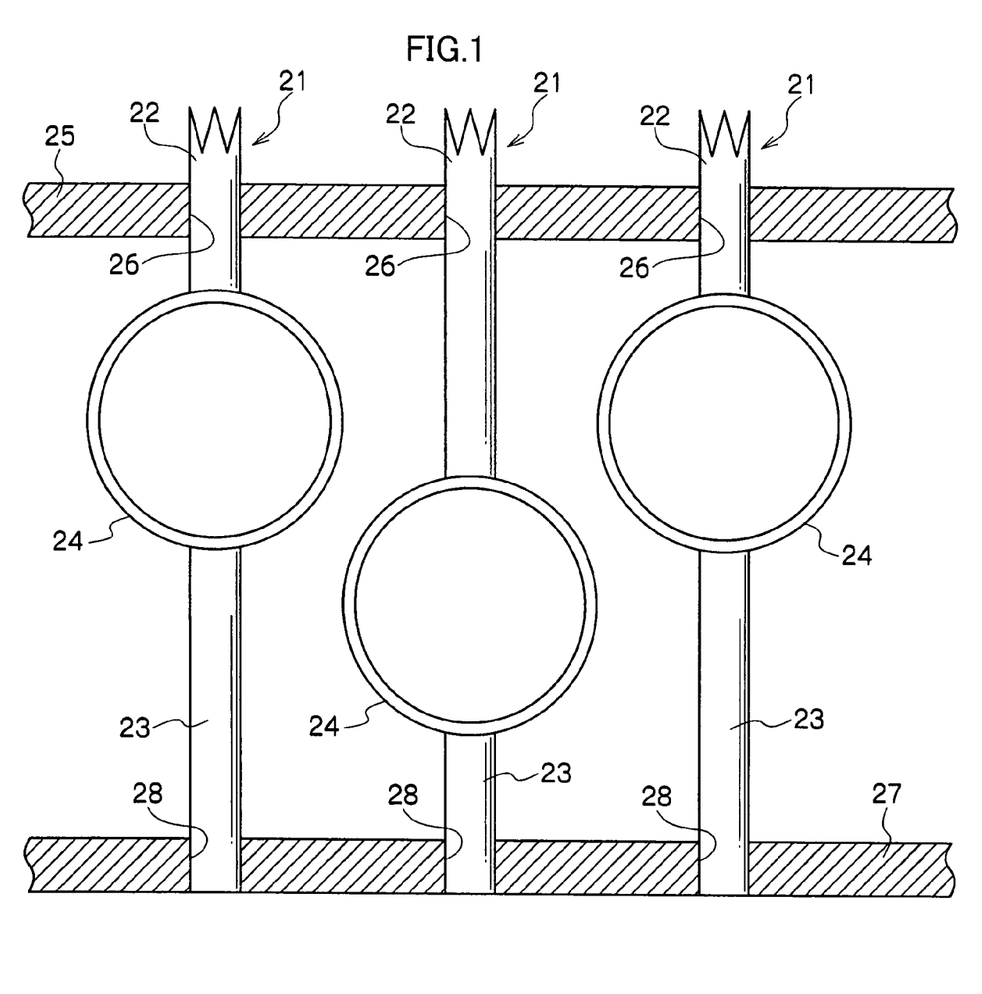
FIG. 1 is a side view showing a contact according to a first embodiment of the present invention.
Figure 2A:
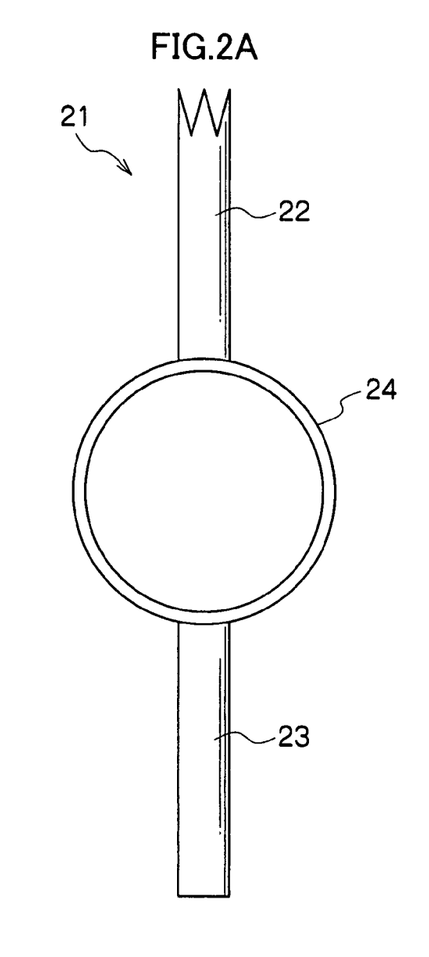
Figure 2B:
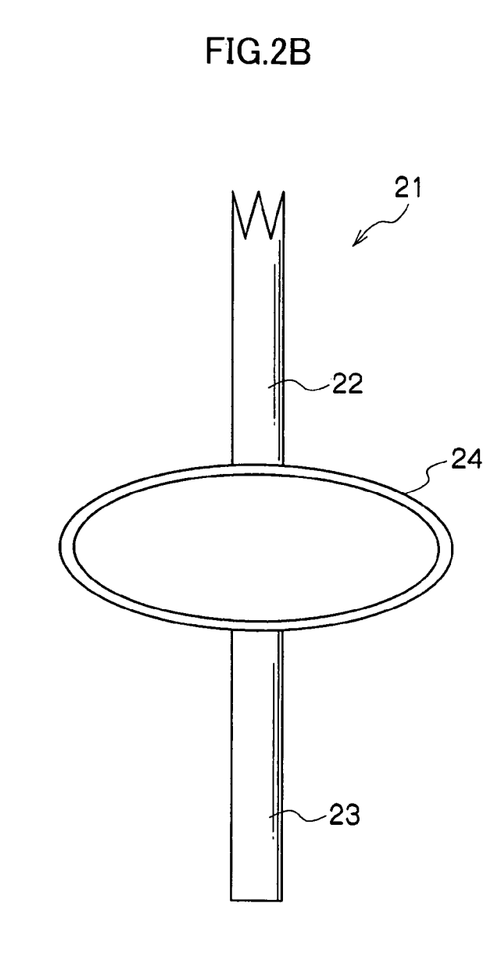

The other-side plunger portion 23 is a member located on the lower side in FIG. 1 and is slidably inserted in a slide support hole 28 of an other-side slide support portion 27. The other-side slide support portion 27 is fixed to the support portion (not shown) on the inspection apparatus side. The tip edge portion (lower edge portion) of the other-side plunger portion 23 is processed for easy electrical contact with a terminal or the like on the opposite side. The other-side slide support portion 27, as well as the one-side slide support portion 25, is made of a material with insulation characteristics so as not to cause a negative effect on transmission of electrical signals at the other-side plunger portion 23. It is noted that the other-side plunger portion 23 is herein slidably supported by the other-side slide support portion 27 but may be fixed and directly connected to a wire.

The elastic deformation portion 24 is a member integrally connected to the one-side plunger portion 22 and the other-side plunger portion 23 to support them integrally. The one-side plunger portion 22 and the other-side plunger portion 23 and the elastic deformation portion 24 are joined to one another by laser welding or the like. These three members constitute the contact 21. The elastic deformation portion 24 is made of an annular elastic member. As the elastic deformation portion 24 is a microscopic member having a diameter of approximately 1 mm or less, it is formed accurately by an electroforming method or the like. A nickel alloy may be used as a material for the elastic deformation portion 24. Also, the elastic deformation portion 24 is made of a material having conductivity as well as elasticity and electrically connects the one-side plunger portion 22 to the other-side plunger portion 23.

The elastic deformation portions 24 are arranged in a zigzag shape in the up-down direction with their adjacent heights different from each other alternately in a state where the plural contacts 21 are arranged in an array. The lengths of the one-side plunger portion 22 and the other-side plunger portion 23 are adjusted in accordance with the positions of the elastic deformation portions 24 arranged in a zigzag shape in the up-down direction. The contacts 21 are disposed in close proximity to one another in order to meet the demand for miniaturization and fine pitch of ICs, etc. At this time, by arranging the elastic deformation portions 24 in a zigzag shape in the up-down direction, the contacts 21 can be closer to one another, thus to meet the demand for fine pitch of ICs, etc.

The one-side slide support portion 25 and the other-side slide support portion 27 are used as upper and lower plates of e.g., an IC socket, and the numerous contacts 21 are housed therein.

The contact 21 structured as above is operated in the following manner.

As the elastic deformation portion 24 formed in an annular shape and made of a conductive elastic member is integrally connected to the one-side plunger portion 22 and the other-side plunger portion 23, the elastic deformation portion 24 has electrical signals transmitted between the one-side plunger portion 22 and the other-side plunger portion 23. Accordingly, it has electrical signals transmitted between a terminal or the like that the tip edge portion of the one-side plunger portion 22 contacts and a terminal or the like that the tip edge portion of the other-side plunger portion 23 contacts.

At this time, when the one-side plunger portion 22 and the other-side plunger portion 23 contact the respective terminals or the likes and are thrust to each other, the pressure is absorbed by elastic deformation of the elastic deformation portion 24, the one-side plunger portion 22 approaches to and separates from the other-side plunger portion 23, and the contact 21 expands and contracts elastically. Thus, the one-side plunger portion 22 and the other-side plunger portion 23 contact the respective terminals or the like reliably under uniform pressure. Even in a case where the heights of the terminals or the likes are not uniform, elastic deformation of the elastic deformation portion 24 enables reliable contact between the one-side plunger portion 22 or the other-side plunger portion 23 and each terminal or the like.

Also, since the elastic deformation portions 24 are arranged in a zigzag shape in the up-down direction with their adjacent heights different from each other, the adjacent elastic deformation portions 24 do not interfere with each other even when each elastic deformation portion 24 is deformed (state in FIG. 2 (B)) along with expansion/contraction of the contact 21.

Consequently, even in a case where the heights of the terminals or the likes that the respective contacts 21 contact are not uniform, the elastic deformation portions 24 are deformed to absorb the height difference of the terminals or the likes, which leads to reliable contact.

By arranging the elastic deformation portions 24 in a zigzag shape, the contacts 21 can be closer to one another, thus to meet the demand for fine pitch of ICs, etc.

Since the contact 21 consists of the one-side plunger portion 22, the other-side plunger portion 23, and the elastic deformation portions 24, the structure is simple, and the contact 21 can be smaller and shorter in response to further miniaturization and finer pitch of inspection objects such as ICs. Also, since the structure is simple, the manufacturing cost can be reduced.

(B) Second Embodiment

Next, a second embodiment of the present invention will be explained.

The present embodiment relates to a connecting apparatus having a contact plate for supporting the contacts 21 of the first embodiment.

The present embodiment shows an example of using a connecting apparatus in an IC socket. An IC socket 31 mainly comprises a connecting apparatus 32, a housing 33, and a frame 34, as shown in FIGS. 3 to 6.

The connecting apparatus 32 is constituted by the contacts 21 and the housing 33 as a contact plate.

The contact 21 is the contact 21 in the aforementioned first embodiment. The contact 21 is a member that electrically contacts a terminal (not shown) disposed in an IC circuit. Herein, plural contacts 21 are arranged in a matrix form.

The housing 33 is a contact plate that integrally supports the respective contacts 21 and makes these contacts 21 contact with the respective terminals of the aforementioned IC circuit. The housing 33 is formed in an approximately thick square plate shape in its entirety. At the center of the housing 33, plural guide recesses 35 are provided. The guide recess 35 is a recess that fits in with the elastic deformation portions 24 of the aforementioned respective contacts 21 to house and support the respective elastic deformation portions 24. The width of the guide recess 35 is set to be in approximately the same dimension as that of the width of the elastic deformation portion 24. Thus, the guide recess 35 supports the elastic deformation portions 24 to be deformable and slidable. Eleven guide recesses 35 are arranged in parallel. In each guide recess 35, eleven contacts 21 are inserted so that their elastic deformation portions 24 are arranged in a zigzag shape in the up-down direction with their heights different from each other. The length and the number of the guide recesses 35 are set in accordance with the number of the contacts 21 to be provided therein.

Figure 4:
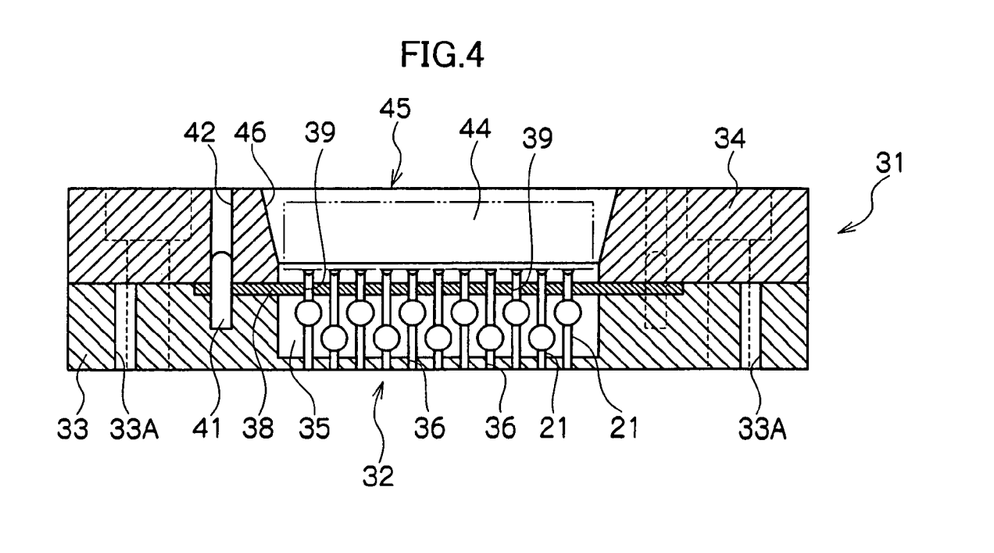
FIG. 4 is a cross-sectional view obtained along the A-A line of FIG. 3.
Figure 5:
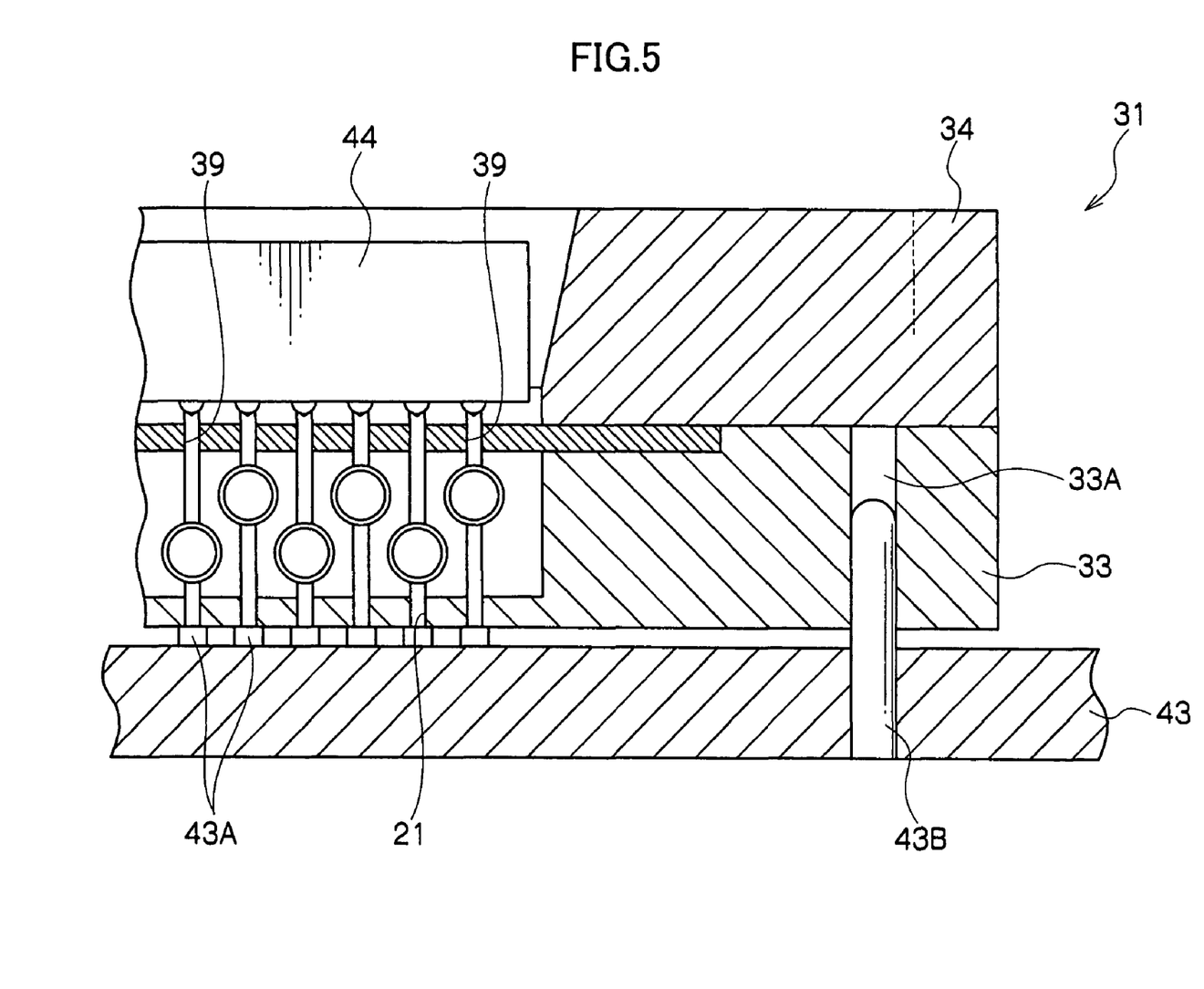
FIG. 5 is a cross-sectional view of a main part showing the IC socket according to the second embodiment of the present invention.
Figure 6:
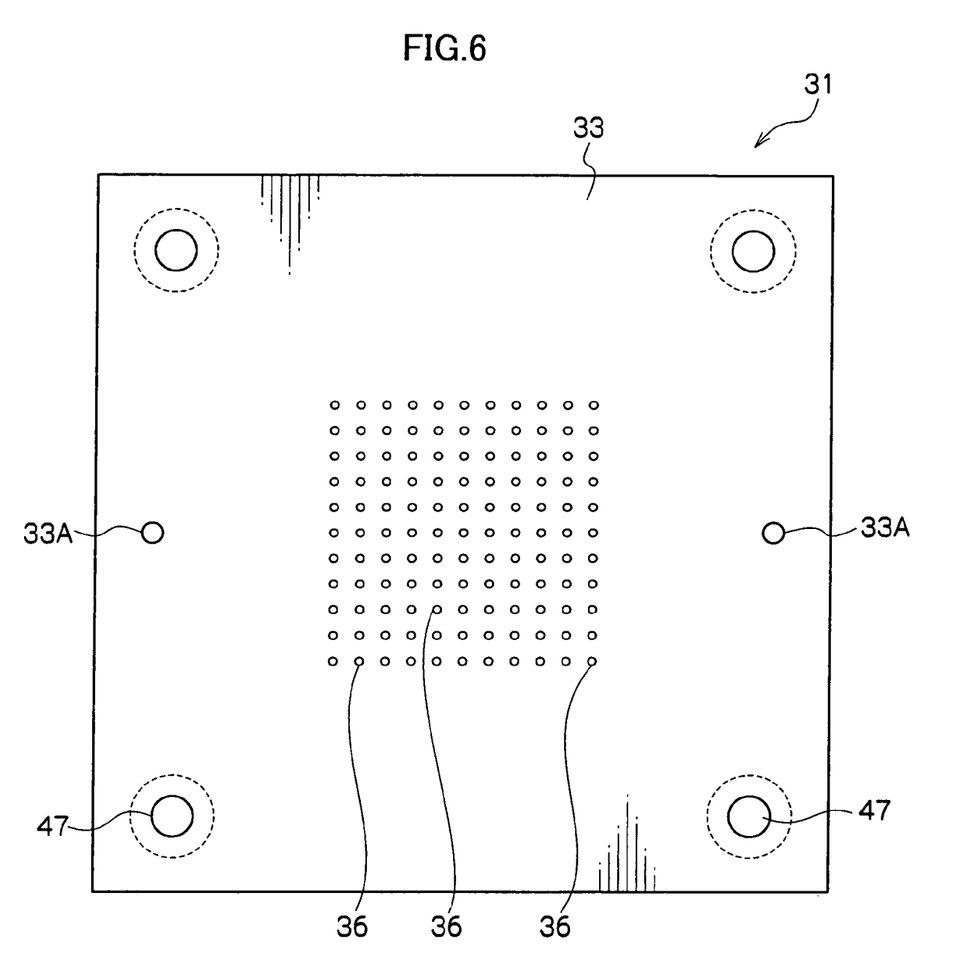
FIG. 6 is a bottom view showing the IC socket according to the second embodiment of the present invention.

On the bottom surface of each guide recess 35, slide support holes 36 are provided. As many slide support holes 36 as the number of the contacts 21 to be inserted are provided. The positions of the respective slide support holes 36 are set to correspond to the set positions of the respective contacts 21. The bottom surface wall of each guide recess 35 constitutes the other-side slide support portion 27 in the first embodiment. Positioning holes 33A are provided at two positions of the housing 33. In these positioning holes 33A, positioning pins 43B of an after-mentioned wiring board 43 are fitted for positioning.

On the upper side surface of the housing 33, a guide plate 38 is attached. This guide plate 38 is a member having a similar function to that of the one-side slide support portion 25 in the first embodiment. The guide plate 38 is set to size enough to cover all of the respective guide recesses 35 and is attached to cover these guide recesses 35. The guide plate 38 is provided with plural slide support holes 39 in a similar manner to that of the one-side slide support portion 25 in the first embodiment. The position and the number of the slide support holes 39 are set in accordance with the set positions of the respective contacts 21.

Figure 3:
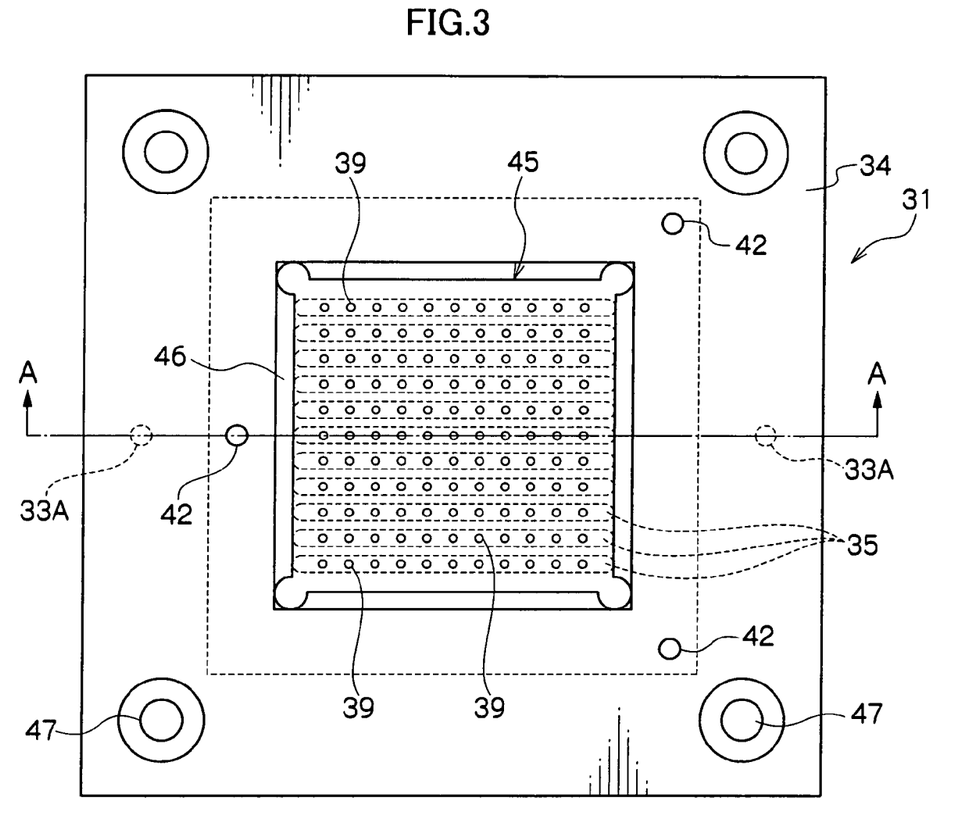
FIG. 3 is a plan view showing an IC socket according to a second embodiment of the present invention.

Also, on the upper side surface of the housing 33, guide pins 41 are provided. Each guide pin 41 is a member for positioning and supporting the housing 33 and the frame 34. The guide pin 41 is also a member for positioning and supporting the housing 33 and the guide plate 38. The guide pins 41 are buried in three positions of the housing 33. The frame 34 and the guide plate 38 respectively have fitting holes 42 at positions in alignment with the guide pins 41. The housing 33 is set on the wiring board 43 of an inspection apparatus, and the respective contacts 21 are electrically connected to respective electrodes 43A provided on this wiring board 43, respectively. The wiring board 43 is also provided with the positioning pins 43B. Each positioning pin 43B is a member fitted in the positioning hole 33A of the aforementioned housing 33 to position and support the housing 33 accurately.

The frame 34 is a member for positioning, housing, and supporting a device 44 as an object of inspection. The frame 34 is formed in an approximately thick square plate shape in its entirety in a similar manner to that of the housing 33. At the center of the frame 34, a fitting portion 45 for positioning, housing, and supporting the device 44 is provided. The fitting portion 45 is formed as a hole penetrating the center of the frame 34 to be in the shape of the device 44. The dimension of the fitting portion 45 is set to correspond to the dimension of the device 44 as an object of inspection. Specifically, the bottom portion of the fitting portion 45 is set to correspond approximately to the dimension of the device 44. The fitting portion 45 is provided with a sloped surface 46 so as to extend outward. The sloped surface 46 is a portion for facilitating insertion of the device 44 and positioning, housing, and supporting it easily. On the bottom portion of the fitting portion 45, the guide plate 38 of the housing 33 is located. At the four corners of the frame 34, screw holes 47 extending to the housing 33 are provided, and the housing 33 and the frame 34 are fixed to each other by screws (not shown).

In the IC socket 31 structured as above, the device 44 is housed into the fitting portion 45 along the sloped surface 46. Accordingly, the device 44 is positioned and supported accurately. At the same time, terminals (not shown) on the lower side surface of the device 44 contact the upper edge portions of the one-side plunger portions 22 of the contacts 21.

At this time, in a case where the heights of the respective terminals of the device 44 are not uniform, the respective one-side plunger portions 22 are not thrust uniformly, and some are thrust strongly while others are thrust weakly. These differences in thrusting forces are absorbed by deformation of the elastic deformation portions 24. As a result, the respective one-side plunger portions 22 are thrust to the respective terminals with approximately uniform thrusting forces for reliable electrical connection.

Subsequently, inspection signals are transmitted from a control section and are applied to the device 44 via each one-side plunger portion 22 and each terminal, and an operation test, etc. is conducted.

As described above, even in a case where the heights of the respective terminals of the device 44 that the respective contacts 21 contact are not uniform, the elastic deformation portions 24 are deformed to absorb the height difference of the respective terminals, which leads to reliable contact.

By arranging the respective elastic deformation portions 24 of the contacts 21 arranged in plural arrays in a zigzag shape in the up-down direction, the respective contacts 21 can be closer to one another, thus to meet the demand for fine pitch of the IC.

Since the contact 21 consists of the one-side plunger portion 22, the other-side plunger portion 23, and the elastic deformation portions 24, the length and the arranging distance of the contact 21 can be shortened by adjustment of the lengths of the one-side plunger portion 22 and the other-side plunger portion 23 or adjustment of the diameter of the elastic deformation portion 24. This enables the contact 21 to be smaller and shorter in response to further miniaturization and finer pitch of the IC. Also, since the structure is simple, the manufacturing cost can be reduced.

C) Modification Examples

Figure 7:
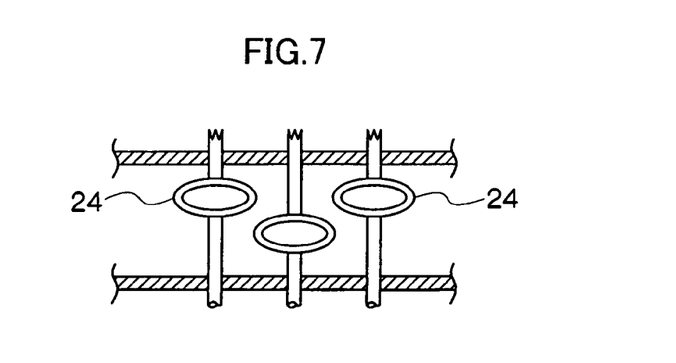
FIG. 7 is a side view showing a first modification example of the present invention.
Figure 8:
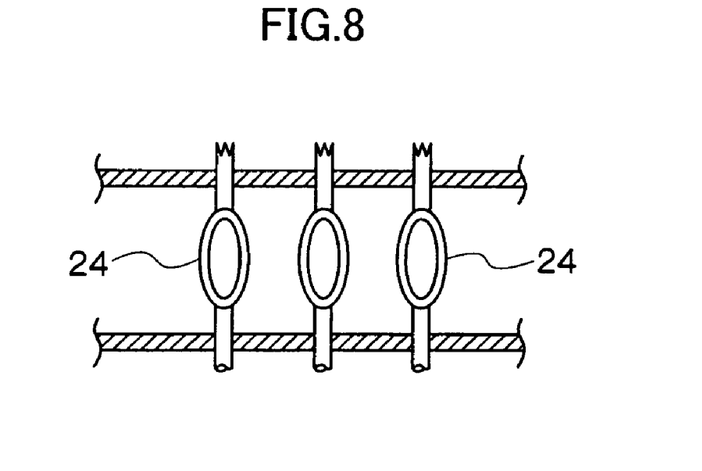
FIG. 8 is a side view showing a second modification example of the present invention.

Meanwhile, although the elastic member constituting the elastic deformation portion 24 is formed in an annular shape in the aforementioned embodiments, the elastic deformation portion of the present invention is not limited to one in an annular shape but may be in other shapes as long as it can be connected to the one-side plunger portion 22 and the other-side plunger portion 23 respectively and support them elastically. For example, the elastic deformation portion 24 may be in a shape of an oval extending horizontally as shown in FIG. 7 or may be in a shape of an oval extending vertically as shown in FIG. 8. It may be in other shapes such as a polygonal annular shape.

Figure 9:
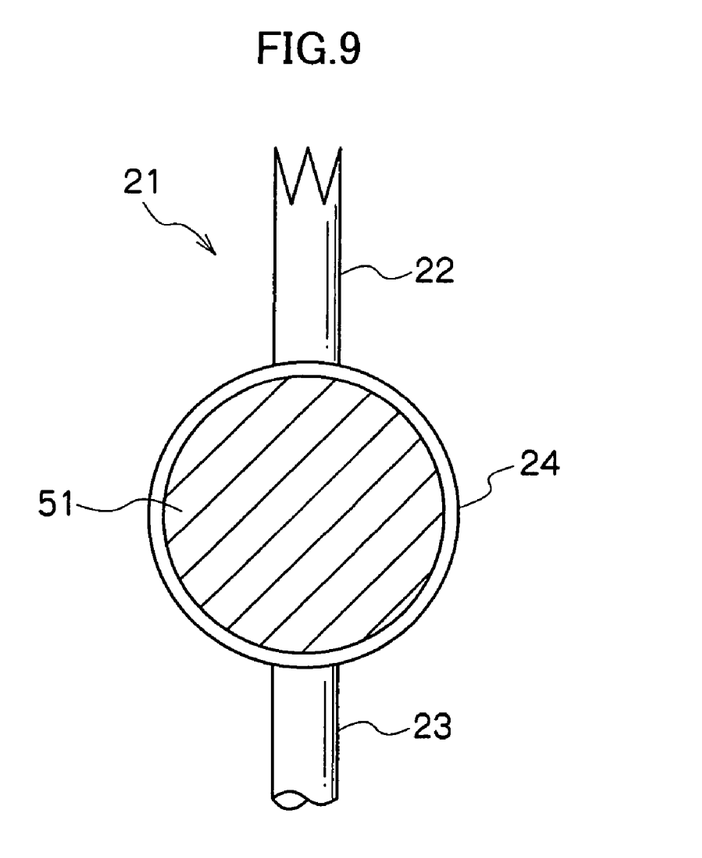
FIG. 9 is a side view showing a third modification example of the present invention.

Although the elastic deformation portion 24 is formed in a hollow annular shape in the aforementioned embodiments, the inside of the elastic deformation portion 24 may be filled with an elastic body 51 as shown in FIG. 9. By changing the material for this elastic body 51, the elastic force of the elastic deformation portion 24 can be adjusted over a wide range. Further, in this case, the annular elastic deformation portion 24 itself may be made of a material without elasticity as long as the material has conductivity or may be made of a material with less elasticity.

Figure 10:
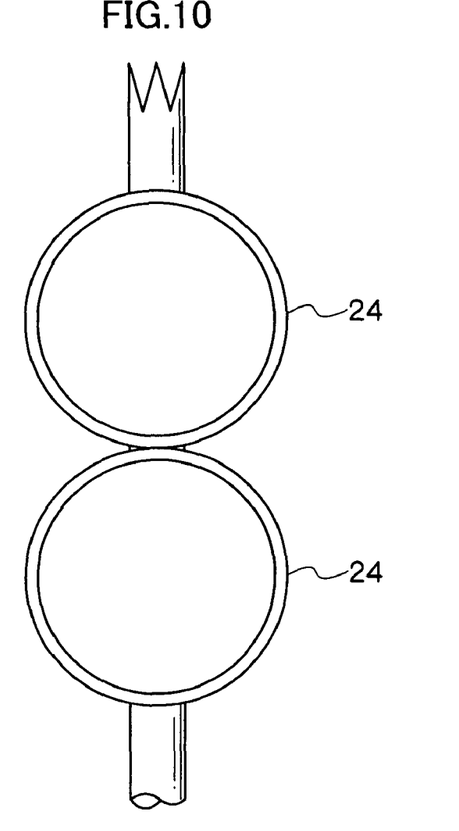
FIG. 10 is a side view showing a fourth modification example of the present invention.

Although only one elastic deformation portion 24 is provided in the aforementioned embodiments, two elastic deformation portions 24 may be connected in the up-down direction as shown in FIG. 10, or three or more may be connected. By doing so, the strokes of the one-side plunger portion 22 and the other-side plunger portion 23 can be extended without extending the width (diameter) of each elastic deformation portion 24 very much.

Figure 11:
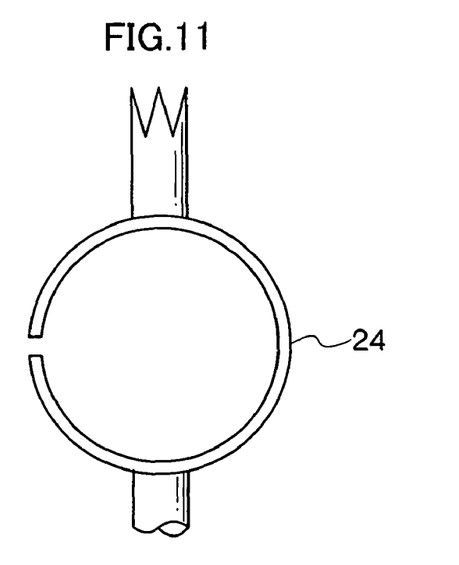
FIG. 11 is a side view showing a fifth modification example of the present invention.

Although the elastic deformation portion 24 is formed in an annular shape in the aforementioned embodiments, a part of the annular elastic deformation portion 24 may be cut as shown in FIG. 11. This can reduce the elastic force of the elastic deformation portion 24.

Figure 12:
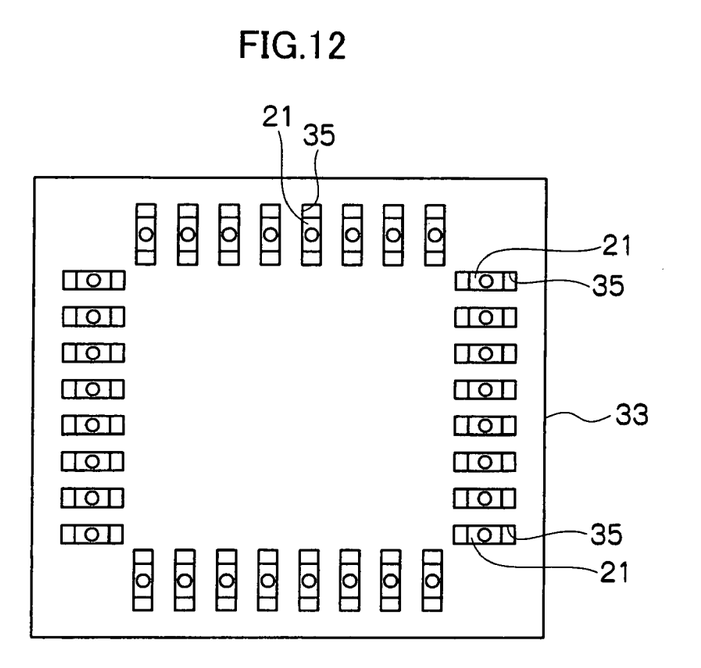
FIG. 12 is a side view showing a sixth modification example of the present invention.
Figure 13:
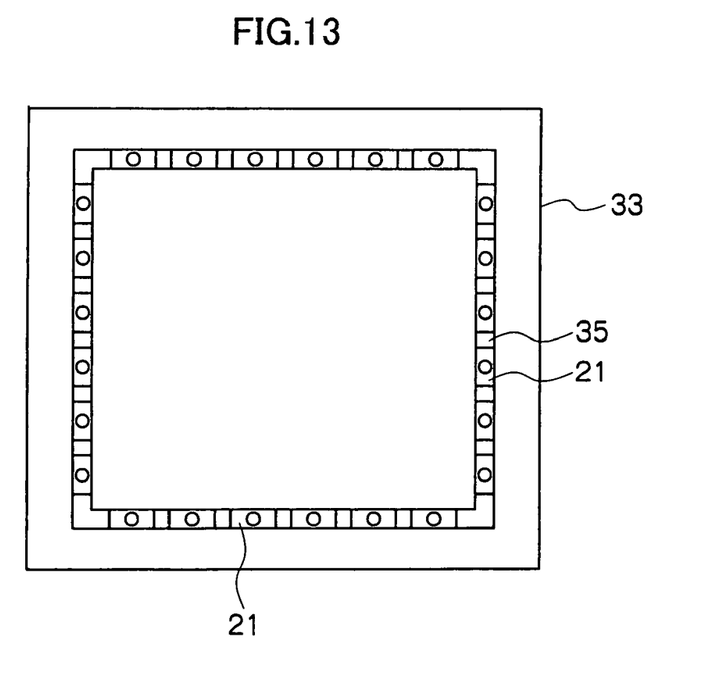
FIG. 13 is a side view showing a seventh modification example of the present invention.

Although the plural elongated guide recesses 35 are arranged in parallel in the aforementioned second embodiment, each of them may be constituted by a short recess in which one contact 21 can be inserted, and they may be arranged in parallel around the housing 33, as shown in FIG. 12. Also, the guide recess 35 may be formed in a square annular shape on the rim of the housing 33 as shown in FIG. 13. In this case, the contacts 21 are arranged and inserted in the square annular guide recess 35.

The aforementioned modification examples may be embodied individually, or two or three of them may be combined as needed.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. An array of plural contacts electrically contacting corresponding wire terminals,
    wherein each contact comprises:
        a one-side plunger portion;
        an other-side plunger portion; and
        an elastic deformation portion provided between said plunger portions,
    wherein said plural contacts extend in parallel in a first direction;

wherein said elastic deformation portion is a single annular and conductive elastic member integrally connected to said one-side plunger portion and said other-side plunger portion;

wherein the lengths of adjacent one-side plunger portions are different whereby adjacent elastic deformation portions of said plural contacts are arranged offset from each other in the first direction, without contacting each other and in a zigzag pattern extending in a second direction which is transverse to the first direction; and wherein said adjacent elastic deformation portions each have a dimension extending in the second direction, the elastic deformation portions overlapping in said dimension.

2. The array of plural contacts according to claim 1, wherein the inside of said annular elastic deformation portion is filled with an elastic body.

3. The array of plural contacts according to claim 1, wherein said plural annular elastic deformation portions are connected in the up-down direction.

4. The array of plural contacts according to claim 1, wherein a part of said annular elastic deformation portion is cut.

5. The array of plural contacts according to claim 1, further comprising parallel and spaced upper and lower support plates wherein the upper support plate has a plurality of holes, each of which holes slidably supports one of the one-side plunger portions and is paired in alignment with a slide hole in the bottom plate which slidably supports an other-side plunger portion connected to the one one-side plunger portion through an elastic deformation portion.

6. The array of plural contacts according to claim 1, wherein each elastic deformation portion is symmetrical in both the first and second directions and wherein the one-side plunger portion and the other-side plunger portion of a contact are aligned with a cross-sectional center of the elastic deformation portion and with each other.

7. The array of plural contacts according to claim 1, wherein said one-side plunger portion and said other-side plunger portion are directly fixed to opposite sides of an elastic deformation portion and are aligned with each other.

8. A connecting apparatus comprising:
a plurality of contacts for electrically contacting terminals disposed on an object to be inspected; and
a contact plate for integrally supporting said plurality of contacts extending in parallel in a first direction and arranged for contact with said terminals of said object,
wherein said each contact comprises a one-side plunger portion, an other-side plunger portion, and a single annular elastic deformation portion provided between and electrically connecting said plunger portions, and
wherein said contact plate has a guide recess housing said elastic deformation portions of said respective contacts in a linear array;
wherein said guide recess is a slot elongated in a second direction transverse to the first direction;
wherein the lengths of adjacent one-side plunger portions are different whereby adjacent elastic deformation portions of said plural contacts are arranged offset from each other in the first direction, without contacting each other and in a zigzag pattern extending in a second direction; and
wherein said adjacent elastic deformation portions each have a dimension extending in the second direction, the elastic deformation portions overlapping in said dimension.

9. The connecting apparatus according to claim 8, wherein the inside of said annular elastic deformation portion is filled with an elastic body.

10. The connecting apparatus according to claim 8, wherein said plural annular elastic deformation portions are connected in the up-down direction.

11. The connecting apparatus according to claim 8, wherein a part of said annular elastic deformation portion is cut.

12. The connecting apparatus according to claim 8, further comprising parallel and spaced upper and lower support plates wherein the upper support plate has a plurality of holes, each of which holes slidably supports one of the one-side plunger portions and is paired in alignment with a slide hole in the bottom plate which slidably supports an other-side plunger portion connected to the one one-side plunger portion through an elastic deformation portion.

13. The connecting apparatus according to claim 8, wherein each elastic deformation portion is symmetrical in both the first and second directions and wherein the one-side plunger portion and the other-side plunger portion of a contact are aligned with a cross-sectional center of the elastic deformation portion and with each other.

14. The connecting apparatus according to claim 8, wherein said contact plate has a plurality of guide recesses, each guide recess housing a linear array of said elastic deformation portions of said contacts.

15. The connecting apparatus according to claim 8, wherein said guide recess has a width approximately the same dimension as that of the width of the elastic deformation portion.

16. The connecting apparatus according to claim 8, wherein said one-side plunger portion and said other-side plunger portion are directly fixed to opposite sides of an elastic deformation portion and are aligned with each other.

* * * * *